United States Patent [19]

Bloss et al.

[11] Patent Number: 4,857,361

[45] Date of Patent: Aug. 15, 1989

[54] HAZE-FREE INFRARED-REFLECTING COATED GLASS

[75] Inventors: Karl H. Bloss, Pittsburgh; James A. Davis, Apollo; George A. Neuman, Pittsburgh, all of Pa.

[73] Assignee: PPG Industries, Inc., Pittsburgh, Pa.

[21] Appl. No.: 182,643

[22] Filed: Apr. 18, 1988

[51] Int. Cl.$^4$ .......................... B05D 5/12; B05D 5/06
[52] U.S. Cl. .................. 427/109; 427/126.3; 427/166; 427/226; 427/255; 427/255.2; 427/255.3
[58] Field of Search ............ 427/109, 126.3, 164, 427/226, 166, 255, 255.2, 255.3; 556/94

[56] References Cited

U.S. PATENT DOCUMENTS

| | | | |
|---|---|---|---|
| 2,560,034 | 6/1951 | Eberly | 556/94 |
| 2,957,785 | 10/1960 | Leatherland | 556/94 |
| 3,107,177 | 10/1963 | Saunders et al. | 117/211 |
| 3,499,086 | 3/1970 | Brueckner et al. | 556/94 |
| 3,658,568 | 4/1972 | Donley | 427/166 |
| 3,677,814 | 7/1972 | Gillery | 117/211 |
| 3,710,074 | 1/1973 | Stewart | 219/203 |
| 3,997,461 | 12/1976 | Davie | 556/94 |
| 4,061,491 | 12/1977 | Arndt et al. | 556/94 |
| 4,069,630 | 1/1978 | Chess et al. | 52/172 |
| 4,187,336 | 2/1980 | Gordon | 428/34 |
| 4,206,252 | 6/1980 | Gordon | 427/160 |
| 4,263,335 | 4/1981 | Wagner et al. | 427/29 |
| 4,308,316 | 12/1981 | Gordon | 428/336 |
| 4,377,613 | 3/1983 | Gordon | 428/212 |

*Primary Examiner*—Janyce Bell
*Attorney, Agent, or Firm*—Donna L. Seidel

[57] ABSTRACT

A novel organotin coating composition comprising tributyltin dimethylpropionate is disclosed, along with a method for preparing it and a method for pyrolyzing it to form a tin oxide film on the surface of a substrate.

10 Claims, 1 Drawing Sheet

HAZE-FREE INFRARED-REFLECTING COATED GLASS

BACKGROUND OF THE INVENTION

The present invention relates generally to the art of infrared-reflecting coated glass products, and more particularly to non-irridescent, high transmittance, low emissivity, infrared-reflecting coated glass products.

Transparent infrared-reflecting films such as tin oxide may be deposited on a substrate such as glass by a variety of methods, including the application of thermally decomposable compounds to a heated surface. Useful methods for forming transparent infrared-reflecting tin oxide films are taught in U.S. Pat. Nos. 3,107,177 to Saunders et al, 3,677,814 to Gillery, and 4,263,335 to Wagner et al.

Tin oxide films are especially effective infrared reflectors at thicknesses of about 1000 to 8000 Angstroms. However, at such thicknesses the films tend to display interference effects, i.e., multiple visible colors commonly referred to as iridescence. These interference effects render the coated glass aesthetically unacceptable for most architectural applications. Iridescence is not observed in thinner films; however, these films have insufficient infrared reflectance to be practically useful. Likewise, iridescence is not observed in thicker films; however, these films tend to be hazy and difficult to make uniformly. Therefore, various methods to mask interference effects have been developed.

U.S. Pat. No. 3,710,074 to Stewart discloses an electrically heated multiple glazed window unit having an electroconductive coating on an enclosed surface and a selective reflecting film having an absolute infrared reflectance of at least 0.7 to improve the heat insulating character of the unit and reduce the visible iridescence of the conductive film.

U.S. Pat. No. 4,069,630 to Chess et al discloses a heat reflecting multiple glazed window comprising a colored, heat absorbing exterior glass sheet having a heat reflecting tin oxide film on its interior surface, and an interior glass sheet which may be either clear glass or colored. The tin oxide film typically has an interference color from first order red to fourth order red, the visual effect of which is attenuated by the colored heat absorbing glass.

U.S. Pat. Nos. 4,187,336; 4,206,252 and 4,308,316 to Gordon disclose transparent glass window structures comprising a glass sheet bearing a first coating of infrared reflective material, wherein the observance of iridescence resulting from the first coating is reduced by a second coating of particular refractive index and thickness providing at least two interfaces forming means to reflect and refract light to interfere with the observance of iridescence.

U.S. Pat. No. 4,377,613 to Gordon discloses transparent window structures comprising a glass sheet bearing a coating of infrared reflective material wherein the observance of iridescence is reduced by provision of a very thin coating system beneath the infrared reflective coating which reflects and refracts light to interfere with the observation of iridescence.

SUMMARY OF THE INVENTION

The present invention provides a method for producing haze-free infrared reflective tin oxide films by the oxidative pyrolysis of a halogen free coating reactant, specifically tributyltin dimethylpropionate, also known as tributyltin trimethylacetate, tributyltin neopentanoate or tributyltin pivalate.

DESCRIPTION OF THE PREFERRED EMBODIMENTS

Figure 1:
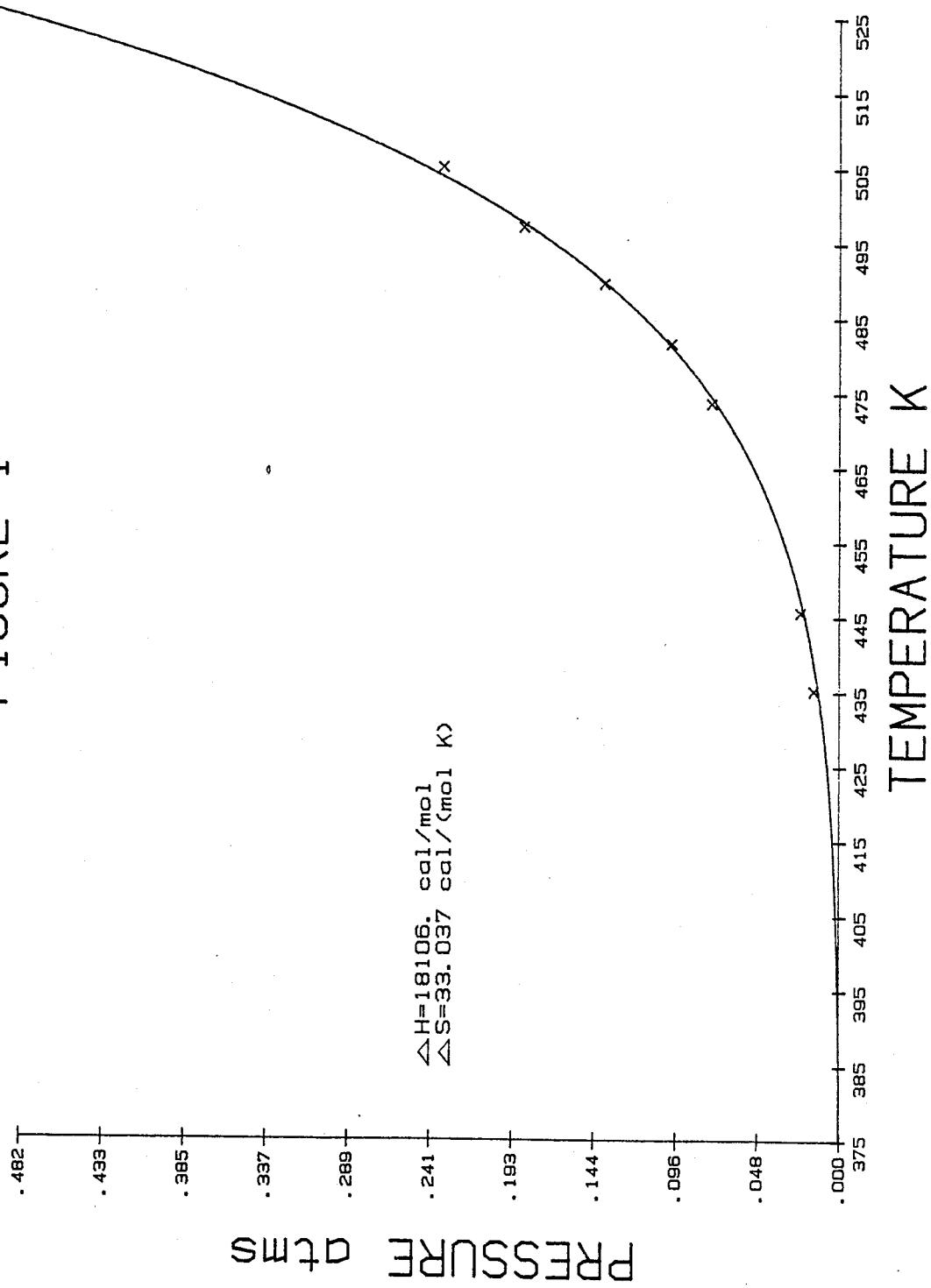
FIG. 1 exhibits the vapor pressure of tributyltin dimethyl propionate in accordance with the present invention.

Infrared reflecting films exhibiting visible interference effects may be useful on a monolithic sheet. Preferred articles in accordance with the present invention are multiple glazed window units comprising at least two panes, preferably both glass. Conventional glass compositions are useful, especially typical soda-lime-silica glass produced on a float line. Heat absorbing tinted glasses may be employed; but for high transmittance applications, clear glass is preferred.

Of the various infrared reflecting films which may be useful for solar energy control in accordance with the present invention, tin oxide is preferred. Tin oxide films may be deposited on glass surfaces by a variety of methods such as pyrolytic deposition, powder coating, chemical vapor deposition and cathode sputtering. Suitable methods include pyrolysis of alkyltin fluorides as taught in U.S. Pat. Nos. 3,677,814 to Gillery and 4,263,335 to Wagner et al; chemical vapor deposition as taught in U.S. Pat. No. 3,850,679 to Sopko et al; powder coating as taught in U.S. Pat. Nos. 4,325,988 to Wagner and 4,344,986 to Henery; and cathode sputtering as taught in U.S. Pat. Nos. 3,477,936 and 3,506,556 to Gillery et al.

Preferred tin oxide infrared reflecting films in accordance with the present invention have a resistivity less than about 50 ohms per square, more preferably in the range of 20 to 30 ohms per square, and a low emissivity, preferably less than 0.4. The thickness of the film is chosen to correspond with a minimum in the luminous reflectance curve. Preferably, the film thickness corresponds to the first minimum since this point represents the lowest visible reflectance obtainable for a tin oxide film. This point corresponds with the second order blue interference effect at a thickness of about 1400 Angstroms. Coating process parameters are adjusted to yield the minimum resistivity for the given thickness to provide maximum infrared reflectance and minimum emissivity. If lower resistivity is desired for higher solar energy performance, a thicker infrared reflecting tin oxide film may be formed, preferably at a thickness near the second minimum in the luminous reflectance curve, most preferably at the thickness corresponding with the third order blue interference effect, about 2750 Angstroms.

In the preferred embodiment wherein the thickness of the tin oxide infrared reflecting film corresponds with the first minimum in the spectral reflectance curve, the film typically appears blue by interference effects, the visible reflectance is about 10 percent, and the resistivity is generally about 45 to 50 ohms per square.

Articles in accordance with the present invention are effective for passive solar heating applications because the high transmittance allows solar energy (light and heat) into a structure, while the high infrared reflectance and low emissivity keep heat inside the structure from being lost. Because the coating reactant of the present invention is halogen-free, the tin oxide films of the present invention are free of haze caused by reaction of chlorine with sodium from the glass. The present invention will be further illustrated in detail by the specific examples which follow.

EXAMPLE I

To 1.5 kilogram of ambient-temperature bis-tributyltin oxide, available from Aldrich Chemicals, is added 580 grams of dimethylpropionic acid, available from Exxon as neopentanoic acid, which is in a liquid state at approximately 40° C. The two-phase liquid is heated with magnetic stirring in a reaction flask equipped with a reflux condenser. The mildly exothermic reaction is completed within about one hour maintaining a gentle reflux. The reflux condenser is then replaced with a distillation head, through which water and some excess dimethylpropionic acid is distilled off. When the contents of the reaction/distillation flask begin to roil, the distillation is continued at lower pressures. The atmospheric-pressure operation is terminated near 150° C. liquid temperature. After removal of foreruns, the main fraction, tributyltin dimethylpropionate, distills sharply at 154°±1° C. and 7 torr gage (about 9 torr in-flask pressure) as a water-clear liquid. The yield is about 1.8 to 1.9 kilograms. Upon prolonged standing at ambient, or shortly at refrigerator temperatures, the liquid reaction product congeals to a waxy mass of crystals.

A vapor pressure curve of the newly synthesized tributyltin pivalate is obtained by the boiling reflux method, and is attached as FIG. 1. From these data, the enthalpy and entropy of vaporization are calculated to be 18.7 kilocalories per mole and 34.41 calories per mole-K respectively.

EXAMPLE II

A tin oxide film is deposited from the above tributyltin pivalate by chemical vapor deposition as follows. Tributyltin pivalate is vaporized, and carried in air at a concentration of 1 torr. The vapor is delivered at a rate of 2 centimeters per second in a classic cold-wall reactor to a glass substrate at a temperature of 950° F. (about 510° C.). A thin film having a resistance of 1200 ohms is formed.

EXAMPLE III

In order to improve the conductivity of tin oxide films deposited from tributyltin pivalate, trifluoroacetic acid is added at 5 percent by weight. A glass substrate is heated in a furnace at 1265° F. (about 685° C.) for four and a half minutes. The glass, traveling at 300 inches (about 7.6 meters) per minute, has a temperature of 1169° F. (about 632° C.) at the coating nozzle, which is spaced 0.25 inch (6.35 millimeters) from the glass surface to be coated. The coating reactant flow rate is 97.5 cubic centimeters per minute, and the air supply flow rate to the vaporizer is 16 cubic feet per minute. The air supplied to the vaporizer is heated from about 81° F. (about 27° C.) to 375° F. (about 191° C.). The hot air and coating reactant mixture is heated in the vaporizer, and coating vapor exits at a temperature of about 374° F. (about 190° C.). Upon contact with the hot glass surface, the coating vapor reacts to form a fluorine-doped tin oxide film which has a uniform amber color, indicating a thickness of 900 to 1000 Angstroms, and a resistance of 86 ohms per square.

EXAMPLE IV

A tin oxide film is deposited as in the previous example except that the glass speed is 240 inches (about 6.1 meters) per minute, the glass is heated for 5 minutes in a furnace at 1280° F. (about 693° C.) to Produce a glass temperature at the coater nozzle of 1186° F. (about 641° C.). Carrier air at 85° F. (about 29° C.) is supplied to the vaporizer at 12 cubic feet per minute. The coating vapor temperature is 367° F. (about 186° C.). A slightly thicker tin oxide film is formed. A first order red interference color indicates a film thickness of about 1200 to 1300 Angstroms, and the resistance is 42 ohms per square.

The above examples are offered only to illustrate the present invention. Optimization of the coating apparatus, process parameters, and composition are expected to provide even lower resistance haze-free films and are included within the scope of the invention. The transmittance, reflectance and resistance values may be altered by varying the relative coating thicknesses or by controlling coating process parameters in accordance with the various known coating techniques. The scope of the present invention is defined by the following claims.

We claim:

1. A method of forming a tin oxide coating comprising contacting a surface of a substrate in an oxidizing atmosphere with a mixture consisting essentially of tributyltin dimethylpropionate vapor and a carrier gas at a temperature sufficient to thermally react said tributyltin dimethylpropionate to deposit a tin oxide film on said surface.

2. A method according to claim 1, wherein said substrate is glass.

3. A method according to claim 1, wherein said carrier gas is air.

4. A method according to claim 3, wherein said mixture further comprises a fluorine-containing compound.

5. A method according to claim 4, wherein said fluorine containing compound is trifluoroacetic acid.

6. A method according to claim 5, wherein said mixture comprises about 1 to 10 percent by weight trifluoroacetic acid based on the weight of tributyltin dimethylpropionate.

7. A method according to claim 6, wherein said mixture comprises about 5 percent by weight trifluoroacetic acid.

8. A method according to claim 1, wherein said substrate is contacted with tributyltin dimethylpropionate at a temperature of at least 350° C.

9. A method according to claim 8, wherein said substrate is contacted with tributyltin dimethylpropionate at a temperature in the range of 500° to 650° C.

10. A method according to claim 9, wherein said substrate is contacted with tributyltin dimethylpropionate at a temperature in the range of 630° to 640° C.

* * * * *